United States Patent [19]

Shiba

[11] Patent Number: 4,999,695
[45] Date of Patent: Mar. 12, 1991

[54] MSM TYPE SEMICONDUCTOR LIGHT RESPONSIVE ELEMENT

[75] Inventor: Tetsuo Shiba, Itami, Japan

[73] Assignee: Mitsubishi Denki Kabushiki Kaisha, Japan

[21] Appl. No.: 383,618

[22] Filed: Jul. 24, 1989

[30] Foreign Application Priority Data

Aug. 5, 1988 [JP] Japan ................................. 63-196837

[51] Int. Cl.$^5$ ...................... H01L 27/14; H01L 31/00
[52] U.S. Cl. ........................................ 357/30; 357/15; 357/65
[58] Field of Search .................... 357/15, 30, 22, 65

[56] References Cited

U.S. PATENT DOCUMENTS

| 4,027,319 | 5/1977 | Borrello et al. | 357/15 |
| 4,320,249 | 3/1982 | Yamazaki | 136/255 |
| 4,547,622 | 10/1985 | Fan et al. | 136/249 |
| 4,681,982 | 6/1987 | Yoshida | 357/30 |
| 4,763,176 | 8/1988 | Ito | 357/15 |
| 4,814,836 | 3/1989 | Thompson | 357/22 |

FOREIGN PATENT DOCUMENTS

| 55-134987 | 10/1980 | Japan | 357/30 E |
| 57-71191 | 5/1982 | Japan | 357/30 E |
| 60-10791 | 1/1985 | Japan | 357/30 |
| 62-293786 | 12/1987 | Japan | 357/30 E |

OTHER PUBLICATIONS

Slayman et al., "Frequency and Pulse ... Photoconductor (IDPC)", IEEE Electronic Device Letters, vol. EDL-2, No. 5, May 1981.

Primary Examiner—Andrew J. James
Assistant Examiner—Don Morin
Attorney, Agent, or Firm—Leydig, Voit & Mayer

[57] ABSTRACT

An MSM type semiconductor light responsive element includes a semiconductor substrate, a first semiconductor layer, a pair of electrodes disposed on the first semiconductor layer forming Schottky barriers, and a second semiconductor layer comprising a semiconductor having a larger energy band gap than that of the first semiconductor layer disposed between and contacting the electrodes.

7 Claims, 4 Drawing Sheets

4,999,695

MSM TYPE SEMICONDUCTOR LIGHT RESPONSIVE ELEMENT

FIELD OF THE INVENTION

The present invention relates to a metal-semiconductor-metal (hereinafter referred to as "MSM") type semiconductor light responsive element and more particularly, to a light responsive element free of unstable light amplification.

BACKGROUND OF THE INVENTION

FIG. 2 shows a prior art MSM type photodiode as described in IEEE Electron Device Letters, Vol. EDL-2, No. 5 (1981), pages 112 to 114. In FIG. 2, an undoped GaAs layer 3 for absorbing light is grown on a semi-insulating GaAs substrate 4 by, for example, a metal organic chemical vapor deposition (hereinafter referred to as "MOCVD") method. A pair of Schottky electrodes 1 and 2 are disposed on the light absorption layer 3 at predetermined positions to produce Schottky junctions with the layer 3. Light is incident to the device as shown by an arrow 6.

In operation, a bias voltage is applied between the electrodes 1 and 2. Then, the Schottky barrier at electrode 2 is reverse-biased and the Schottky barrier at electrode 1 is forward biased. Therefore, a depletion layer is produced extending from the electrode 2 toward the electrode 1 having a volume that increases as the applied bias voltage is increased. In order to obtain high speed response, a sufficiently high voltage is applied so that a region between the electrodes 1 and 2 is depleted in the neighborhood of the surface of light absorption layer 3. When light 6 is incident on the biased photodiode, the incident light 6 is absorbed in the light absorption layer 3 and generates electron-hole pairs. The generated electron-hole pairs are separated by the applied electric field and electrons and holes reach the electrodes 2 and 1, respectively, and collected as a photocurrent.

Since the prior art MSM type photo detector is produced on a semi-insulating GaAs substrate 4 and both electrodes 1 and 2 are disposed on a common surface, it has a high degree of compatibility with other electronic circuits and has high speed response and low capacitance. These characteristics make the light receiving element popular in optoelectronic integrated circuits (so-called OEIC).

The prior art MSM type semiconductor light responsive element having the described construction has problems as described below because the light absorption layer 3 is exposed at the uppermost surface of the element.

FIG. 3 shows the distribution of the electric field in the cross-section of the light responsive element. As shown in the figure, the electric field is concentrated at the portions of the electrodes 1 and 2 nearest of each other. Since the generated carriers are concentrated at the nearest portions of the electrodes 1 and 2 and the electric field is strong at the nearest portions of the electrodes, largest variations in the electric field occur at the nearest portions of the electrodes 1 and 2. Furthermore, carriers generated in the light absorption layer 3 are captured by and ionizes traps in the crystal. The lifetimes of the traps vary dependent on, for example, crystallinity or surface properties of the crystal in a range of from about several milliseconds to several microseconds. When these lifetimes are sufficiently long compared with the modulation frequency of the incident signal light, the ionized traps effectively become stationary charges, changing the distribution of the electric field and the flow of the charge of carriers. When the light absorption layer 3 is exposed at the uppermost surface the element and has a large number of surface states, a large number of carriers are trapped, increasing the carrier flow phenomenon further.

FIG. 4(b) shows the energy band structure between the electrodes in the neighborhood of semiconductor surface. When no light is incident on the element, the conduction band edge 8 and valence band edge 9 are positioned at the potentials shown in the figure by the solid lines. When light is incident on the element and carriers are generated at the light absorption layer 12, however, the carriers generated as discussed above are captured by the traps in the neighborhood of the surface of light absorption layer 12 and the traps are ionized and become stationary charges. Therefore, the potentials of the conduction band edge and valence band edge shown by broken lines 8' and 9' of figure 4(b) are lowered and the slope of the bands at the uppermost surface of the light absorption layer 12 becomes steeper. As a result, the width of the barrier through which electrons may tunnel is narrowed, increasing the probability of tunneling and the injection of majority carriers. That phenomenon produces an unstable current amplification and deteriorates the frequency response of the photodiode. In FIG. 4(b), reference numeral 10 designates the Fermi level position in layer 3 and reference numeral 11 designates the position of the Schottky barrier.

SUMMARY OF THE INVENTION

An object of the present invention is to provide an MSM type semiconductor light responsive element having reduced electric field modulation at the electrodes for preventing deterioration of the frequency response.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to the present invention, a layer which is transparent to incident light, i.e., has a wider energy band gap than that of light absorption layer, is provided at between and contacting the electrodes on the first semiconductor layer. Accordingly, the charge carriers generated at the light absorption layer do not reach the electrode where the electric field is concentrated, but reach the electrode at a central portion.

BREIF DESCRIPTION OF THE DRAWINGS

DETAILED DESCRIPTION OF THE PREFERRED EMBODIMENTS

An embodiment of the present invention will be described in detail with reference to the drawings.

Figure 1:
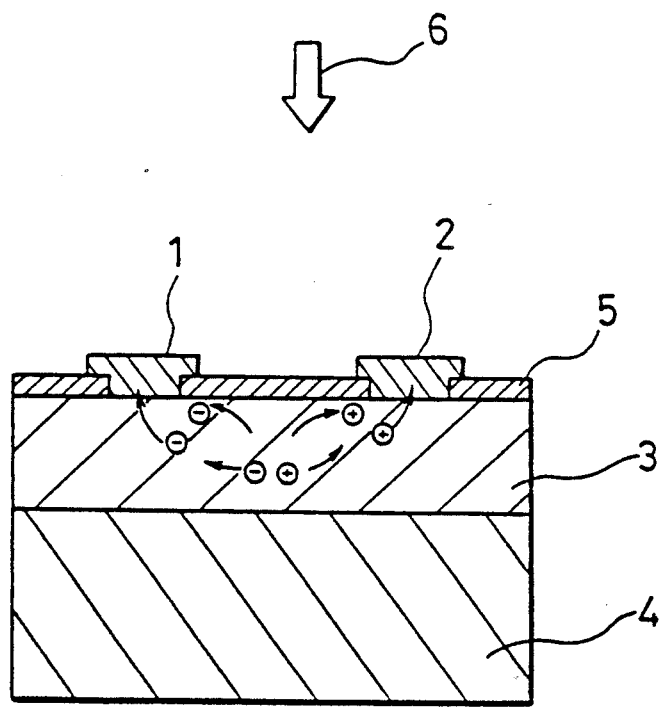
FIG. 1 is a cross sectional view showing an MSM type semiconductor light responsive element according to an embodiment of the present invention.
Figure 2:
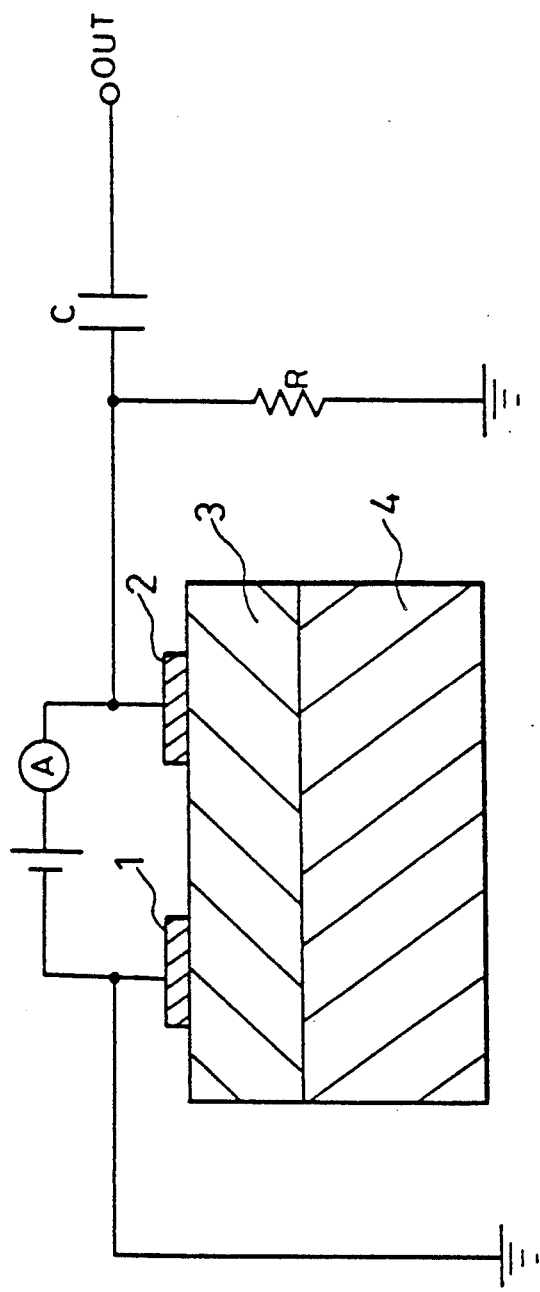
FIG. 2 is a cross sectional view showing an MSM type semiconductor light responsive element according to the prior art.
Figure 3:
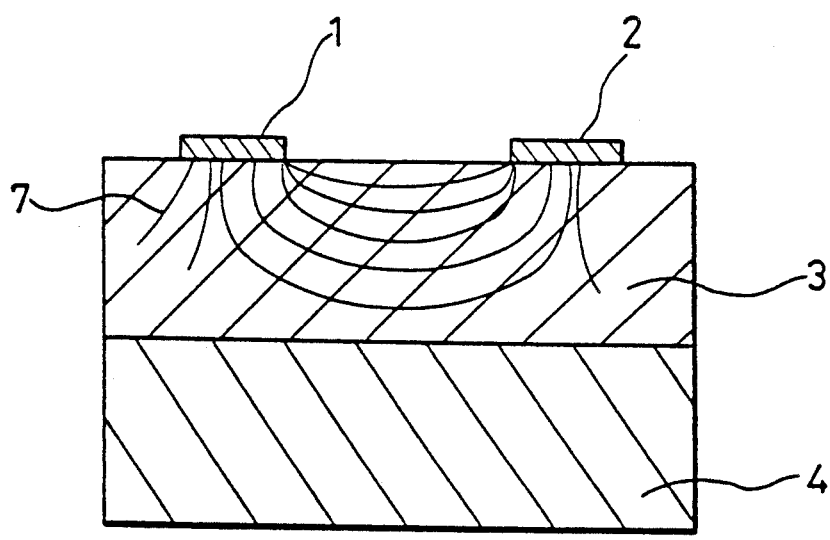
FIG. 3 is a diagram showing a distribution of electric lines of force of the prior art MSM type semiconductor light responsive element.

FIG. 1 shows an MSM type semiconductor light responsive element according to an embodiment of the present invention.

A pair of electrodes 1 and 2 comprising Al or WSi and forming Schottky barriers are disposed on the undoped GaAs layer 3, which functions as a light absorption layer. This light absorption layer 3 is disposed on the semi-insulating GaAs substrate 4. An undoped AlGaAs layer 5 having a larger energy band gap than that of the light absorption layer 3 is disposed on the surface of light absorption layer 3 extending between the pair of electrodes 1 and 2 including from electrode 1 to electrode 2. This MSM type semiconductor light receiving element is produced by firstly depositing an undoped GaAs layer 3 on semi-insulating substrate 4 by MOCVD, an MBE (Molecular Beam Epitaxy) method, or a LPE (Liquid Phase Epitaxy) method, subsequently depositing an undoped AlGaAs layer 5 by a similar method, patterning the undoped AlGaAs layer 5, by, for example, wet etching and depositing electrodes 1 and 2 by sputtering or vapor deposition.

Figure 4A:
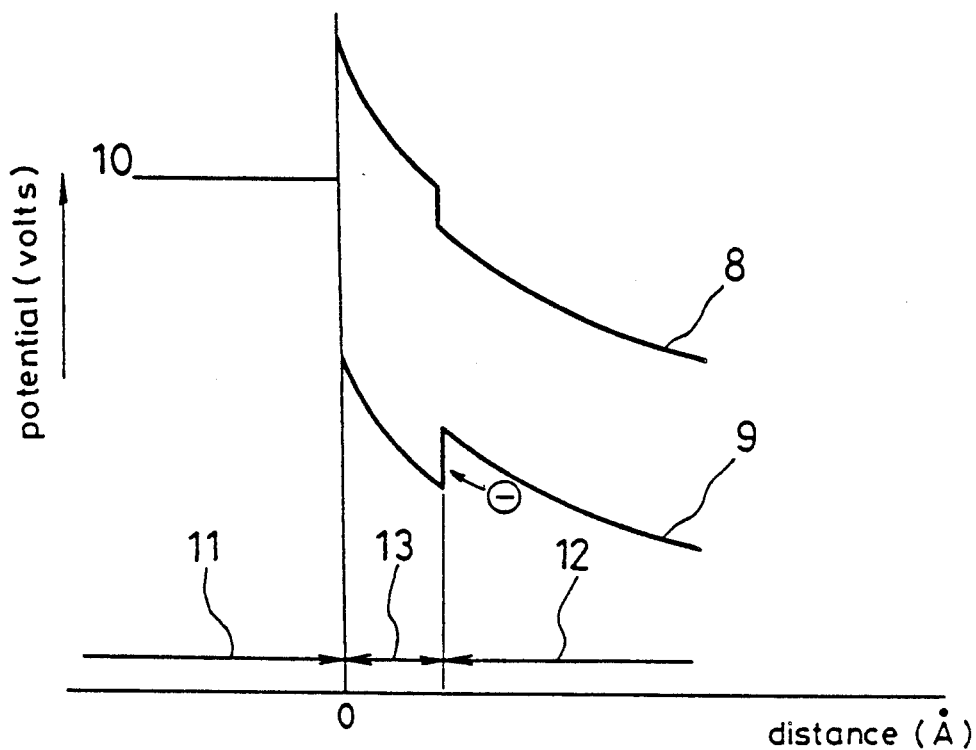
FIGS. 4(a) and 4(b) are diagrams of the energy a band structure in the neighborhood of the semiconductor surface of the device of the present invention and of the prior art device, respectively.
Figure 4B:
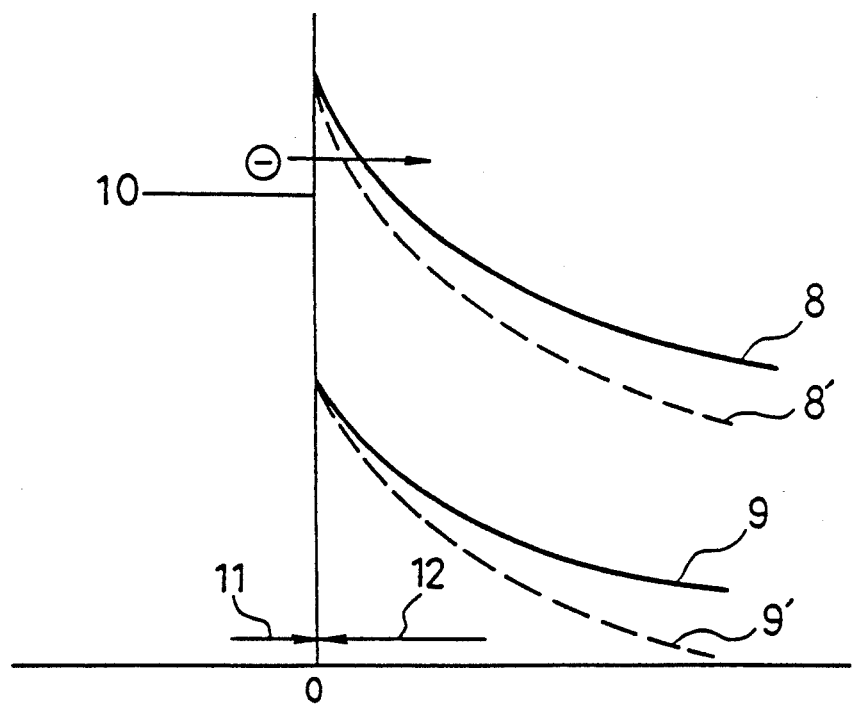

FIG. 4(a) shows the energy band diagram between the electrodes in the neighborhood of the semiconductor surface of the device. In FIG. 4(a) the same reference numerals as those shown in FIG. 4(b) designate the same elements and reference numeral 13 designates an undoped AlGaAs layer.

The device operates as follows.

The light 6 which is incident to the MSM type semiconductor light responsive element passes through the AlGaAs layer 5, is absorbed by the undoped GaAs layer 3 as a light absorption layer and generates electron-hole pairs. Generated carriers flow toward the electrodes 1 and 2 along the direction of electric field. However, since the AlGaAs layer 5 has a larger band gap than GaAs layer 3 as shown in FIG. 4(a), a potential barrier is produced between the interface at the GaAs layer 3 and AlGaAs layer 5. Accordingly, the carriers are prevented by the barrier from flowing toward the surface. That is, the generated carriers proceed along the AlGaAs layer 5 and reach the electrodes 1 and 2 at a central portion of the respective electrodes. Furthermore, since the excited carriers are not injected into the AlGaAs layer 5, there is no band distortion. That is, the nearest portions of the electrodes 1 and 2 which had been producing problems are in contact with the surface of the light absorption layer 3 through the AlGaAs layer 5, thereby producing no traps and no band distortions. As a result, unstable amplification of the photocurrent which had been occurring in the prior art structure is gone and a stable light response is obtained.

While in the above illustrated embodiment GaAs is used for the light absorption layer 3, semiconductor materials such as InGaAs, AlGaSb, HgCdTe, or Si may be used therefor with the same effects as described above.

As discussed above, according to the present invention, a layer which is transparent to incident light, i.e., having a larger energy band gap than that of the light absorption layer, disposed between the electrodes on the absorption layer. Therefore, the light generated carriers do not reach the electrodes at their nearest portions but reach the electrodes at their central portions. Thus, the tunneling phenomenon modulating the electric field at the nearest electrode portions is prevented and a stable optical response is obtained.

What is claimed is:

1. An MSM semiconductor light responsive element comprising:
   a semiconductor substrate;
   a first semiconductor layer disposed on said substrate and having a first surface opposite the substrate;
   a second semiconductor layer having a larger energy band gap than that of said first semiconductor layer disposed on said first surface, having a second surface opposite said first surface, and including first and second openings extending to said first semiconductor layer; and
   first and second Schottky barrier electrodes disposed in and filling the first and second the openings, respectively, each electrode contacting and forming a Schottky barrier with said first semiconductor layer wherein each electrode is partially disposed on the second surface of said second semiconductor layer so that the first and second electrodes are closer to each other on the second surface than in the openings and on said first surface.

2. An MSM semiconductor light responsive element as defined in claim 1 wherein said substrate comprises GaAs.

3. An MSM semiconductor light responsive element as defined in claim 1 wherein said first semiconductor layer comprises undoped GaAs and said second semiconductor layer comprises undoped AlGaAs.

4. An MSM semiconductor light responsive element as defined in claim 1 wherein said electrodes are selected from the group consisting of Al and WSi.

5. An MSM semiconductor light responsive element as defined in claim 1 wherein said first semiconductor layer is selected from the group consisting of InGaAs, AlGaSb, HgCdTe, and Si.

6. An MSM semiconductor light responsive element as defined in claim 1 wherein said first semiconductor layer is undoped.

7. An MSM semiconductor light responsive element as defined in claim 1 wherein said semiconductor substrate is semi-insulating.

* * * * *